US006986197B2

(12) United States Patent
Wu et al.

(10) Patent No.: US 6,986,197 B2
(45) Date of Patent: Jan. 17, 2006

(54) METHOD OF MANUFACTURING AN IC PACKAGE

(75) Inventors: Jian Wu, Singapore (SG); Yan Zhou, Singapore (SG); Shu Chuen Ho, Singapore (SG); Teng Hock Kuah, Singapore (SG)

(73) Assignee: ASM Technology Singapore PTE Ltd., (SG)

( * ) Notice: Subject to any disclaimer, the term of this patent is extended or adjusted under 35 U.S.C. 154(b) by 568 days.

(21) Appl. No.: 10/006,052

(22) Filed: Dec. 6, 2001

(65) Prior Publication Data

US 2004/0003497 A1    Jan. 8, 2004

(51) Int. Cl.
*H01R 43/00* (2006.01)
(52) U.S. Cl. .......................... 29/827; 29/825; 29/841; 29/855; 257/668; 257/758; 438/111; 438/128
(58) Field of Classification Search ................. 29/827, 29/830, 852–855, 739–743; 257/675, 677, 257/786, 795; 174/52.4; 438/111, 118, 123
See application file for complete search history.

(56) References Cited

U.S. PATENT DOCUMENTS

| | | | | |
|---|---|---|---|---|
| 4,859,632 A | * | 8/1989 | Lumbard | 29/593 |
| 5,541,447 A | * | 7/1996 | Maejima et al. | 257/669 |
| 5,724,726 A | * | 3/1998 | Tomita et al. | 29/827 |
| 5,929,517 A | * | 7/1999 | Distefano et al. | 257/707 |
| 6,058,602 A | * | 5/2000 | Fehr | 29/827 |
| 6,240,632 B1 | * | 6/2001 | Ito et al. | 29/827 |
| 6,621,157 B1 | * | 9/2003 | Wirz et al. | 257/692 |
| 2004/0003497 A1 | * | 1/2004 | Wu et al. | 29/855 |

* cited by examiner

*Primary Examiner*—Minh Trinh
(74) *Attorney, Agent, or Firm*—Ostrolenk, Faber, Gerb & Soffen, LLP

(57) ABSTRACT

A method is provided for processing leadframe items of two or more types to form integrated circuit packages. The leadframe items are delivered along respective input paths and are received into holders, which are moved alternately between a processing region and a respective leadframe item reception position on a respective input path such that each of the holders moves to the processing region at a time when the other of the holders moves to its respective reception position. The leadframe items are delivered from the respective reception position to the processing region, and are then sent for encapsulation.

5 Claims, 3 Drawing Sheets

METHOD OF MANUFACTURING AN IC PACKAGE

FIELD OF THE INVENTION

The present invention relates to a method and apparatus for encapsulating an IC (integrated circuit) to form an IC package.

BACKGROUND OF THE INVENTION

Commonly, ICs are mounted on a leadframe and wires are provided between the electrical contacts (pins) of the IC and corresponding electrical contacts on the leadframe. To protect the wires, the leadframes and ICs are encapsulated in plastics material which surrounds and supports the wires. The result of this process is the production of an IC package.

It is common for a manufacturer to provide a family of ICs in which different members of the family have different lead counts. For example, the small outline integrated circuit (SOIC) family has members having 8, 14, 16, 20, 24 and 28 pins. When it is desired to encapsulate these ICs in plastic material to form an IC package, a moulding system is employed which is tailored to the number of leads present on the corresponding IC.

SUMMARY OF THE INVENTION

The present invention aims to provide new and useful methods and apparatus for manufacturing IC packages.

In particular, the present invention aims to provide a single moulding system which is capable of encapsulating a plurality of kinds of ICs having differing lead counts.

In general terms, the invention proposes that lead frames items of two or more types, each type consisting of a respective type of IC mounted on a suitable leadframe, enter a processing system along different paths. Each path terminates at a location where the leadframe items of each type are received by a respective holder. Each holder reciprocates between the respective reception position and a shared processing region to which both holders deliver their leadframe items. In the processing region the ICs are encapsulated to form packages.

Thus, the present invention makes it possible for the processing region to receive the two types of leadframe items in combination. For example, the processing region can wait until a pair of the leadframe items of the respective types has been received, and then process them together.

In general, the leadframe items enter the system supported in magazines. Preferably, the holders carry the magazines also to the processing region and the leadframe items are only extracted from the magazines there.

BRIEF DESCRIPTION OF THE FIGURES

An embodiment of the invention will now be described for the sake of example only with reference to the following figures in which.

DETAILED DESCRIPTION OF THE EMBODIMENT

Figure 1:
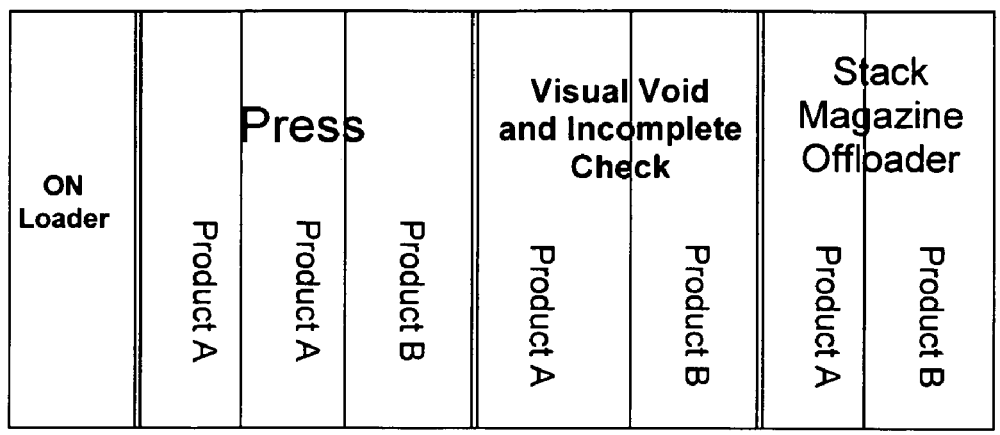
FIG. 1 illustrates schematically a concept employed in the embodiment.

Referring first to FIG. 1, the overall concept of the embodiment is shown. The embodiment is for treating input items of two kinds, referred to here as product A and product B. The product items are lead frames having ICs loaded onto them and wired to them. Thus, the IC only needs to be encapsulated in plastic for the IC package to be complete. Product A corresponds to a first IC on a suitable lead frame, and product B corresponds to a second IC on a suitable lead frame.

The process has four stages. In FIG. 1, each stage is shown consisting of a number of rectangular blocks corresponding to the number of products which are treated to that stage of the process at any one time. In the first stage, "ON loader", products are loaded into the embodiment. The other sections of the embodiment are a "press" section handling two pieces of product A and one piece of product B, a "visual void and incomplete check" stage and a "stack magazine offloader" stage. Each of the stages apart from the first stage handles two product items by duplicating the module, and as shown in FIG. 1 at any given time. In particular, each stage handles one item of product A by one module and one item of product B by another identical module. Apart from the "ON loader" stage, each of the stages may be implemented in the embodiment according to conventional means. The "ON loader" stage can also handle products A and B within the same module, so that there is no need to duplicate the modules.

The embodiment receives in two separate series magazines of two respective kinds. A first kind of magazine (herein referred to as "magazines A") each contain one or more items of product A, and the second kind of magazine (herein referred to as "magazines B") each contain one or more items of product B. A magazine, whether of kind A or kind B, is referred to as "full" when it contains at least one item of the corresponding product.

Figure 2:
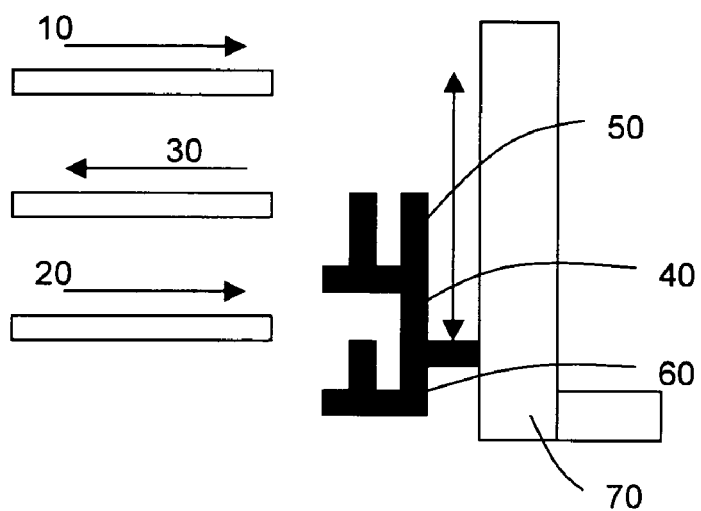
FIG. 2 is a schematic side view of a portion of the embodiment.

FIG. 2 is a schematic side view of a loading device, which is the part of the embodiment responsible for receiving the two series of magazines. The supply of magazines A containing product A is from left to right along an upper path indicated as 10. The separate supply of the magazines B is from left to right along a separate path 20. The embodiment includes an elevator 40 having two holders 50, 60 mounted vertically with the holder 50 above the holder 60. A drive system indicated generally as 70 reciprocates the elevator 40 in a vertical direction, to alternately bring the upper holder 50 into register with the path 10 (such that the upper holder 10 can receive a full magazine A) and to bring the lower holder 60 into register with the path 20 (so that the lower holder 60 can receive a magazine B). At each of the times when one of the holders 50, 60 is in register with the corresponding one of the paths 10, 20, the other of the holders 50, 60 is at an "ejector level" at which the holder is in register with a right-to-left path 30. At this level, the product(s) in the magazine at the ejector level are removed from the full magazine and the emptied magazine is discharged along the path 30.

In other words, the embodiment alternately brings items of product A and of product B to the ejector level, and removes them from their magazine at that level.

It is advantageous that each following stage of the processing performed by the embodiment operates on, at any time, an item of product A and an item of product B. Hence, the elevator 40 must complete a complete cycle of movement in the time which is the length of each of the succeeding processing stages.

Figure 3:
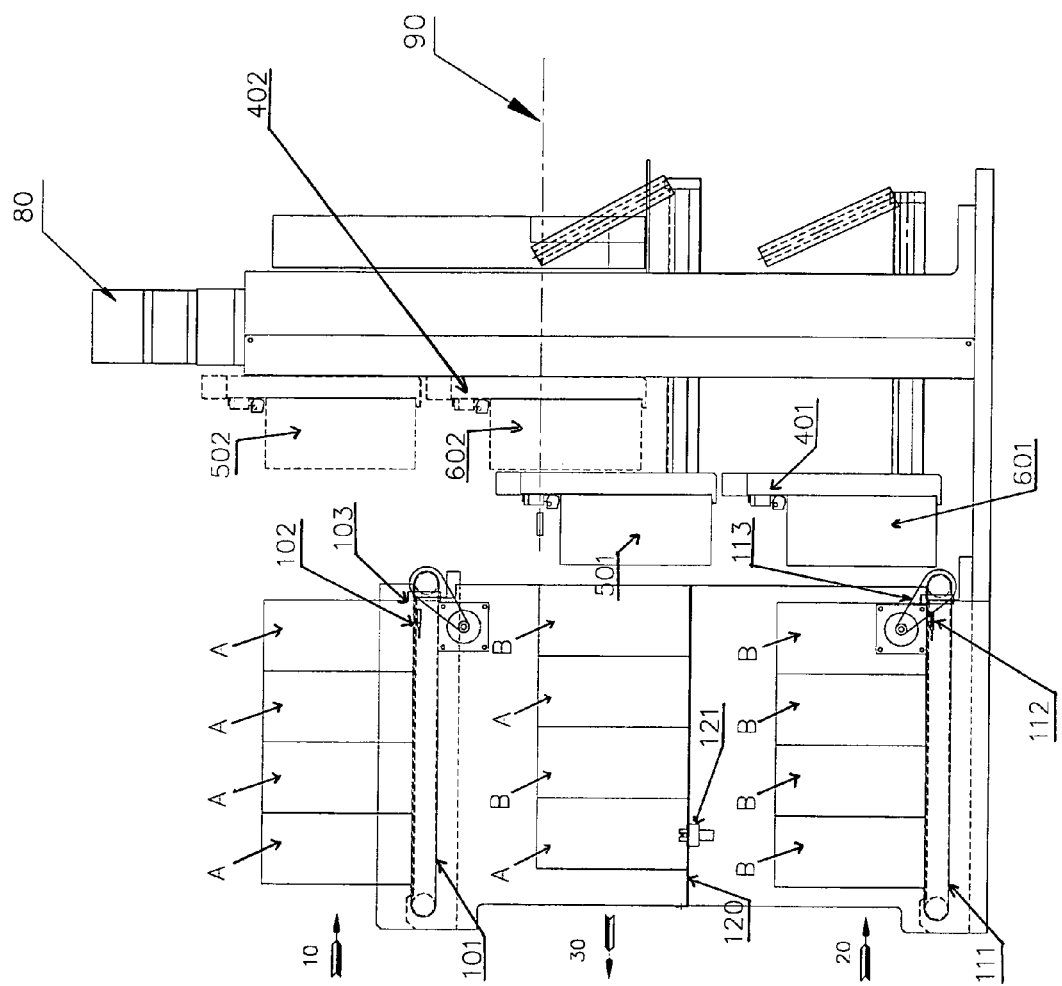
FIG. 3 is a more detailed side view of a portion of the embodiment.

FIG. 3 which is a more detailed side view of a loading device which is a section of the embodiment. In FIG. 3, it is shown that the embodiment has an elevator 401. Elevator 401 has an upper holder 501 and a lower holder 601. The elevators are mounted for vertical movement controlled by a motor system 80 having a brake mechanism. The ejector level is indicated in the figure as 90.

Magazines A (indicated simply as A in FIG. 3) enter the embodiment from left to right along a path 10 defined by an upper conveyor 101. At the front end of the path 10 their presence is detected by a sensor 102, which admits signals to influence the drive mechanism 103 of the upper conveyor 101, so as to stop the conveyor 101 when a magazine A has been brought to the front of the path 10.

Similarly, a bottom conveyor 111 conveys magazines B (labelled in FIG. 3 simply as B) along the path 20, and is provided with a sensor 112 for sensing when a magazine B has been brought to the front of the path and then turning off the drive system 113 for the bottom conveyor 111.

A simple plate 120 defines the path 30 along which empty magazines pass (i.e. there is no conveyor corresponding to the conveyors 101, 111). The plate 120 is provided with a sensor 121 which indicates when a magazine has reached the left end of the path 30, where it should be removed from the embodiment.

Note that the two holders 501, 601 of the elevator 401 are shown in FIG. 3 in a lower position with the upper holder 501 in register with the ejector level 90 (to deliver a magazine there) and the holder 601 in register with the path 20 (to receive a magazine there). The elevator 401 can be moved to an upper position, which is shown dashed in FIG. 3 as 402. In FIG. 3, the upper position of the upper elevator 501 is shown dashed as 502 and that of the lower holder 601 is shown dashed as 602.

The holders alternately provide empty magazines onto the plate 120 at the ejector level 90 so that magazines passing along path 30 are alternately magazines which have carried items of product A and items of product B. The ejector level 90 can be software programmable to suit different applications.

Figure 4:
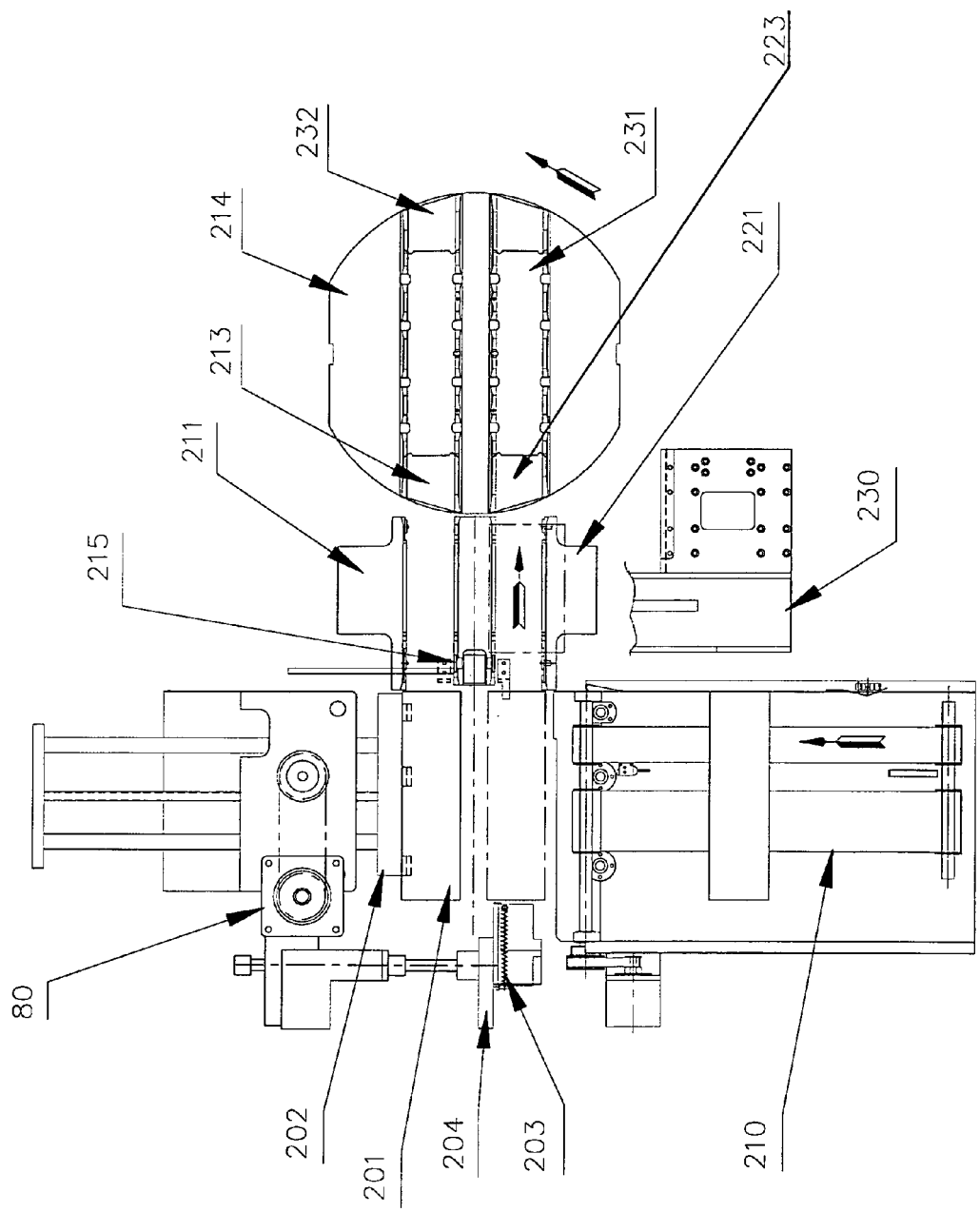
FIG. 4 is a top view of the embodiment.

FIG. 4 shows a view in the direction from the top of FIG. 3, principally at the ejector level 90, which constitutes a processing region of the embodiment.

A first magazine 201 has been brought to the ejector level 90 by a magazine holder 202 which is one of the magazine holders 501, 601 in FIG. 3. The view of FIG. 4 also shows a conveyor 210 which is one of the conveyors 101, 111 in FIG. 3. The embodiment further includes an ejector 204 having a spring push unit 205. The ejector 204 is operative to expel leadframes from the magazine 201 to a position defined by a backtrack mechanism 211, defining a backtrack which leads to a first path 213 on a turntable 214. The embodiment further includes a front track mechanism 221 defining a front track which leads to a second path 223 on the turntable 214. Two rollers 215 are provided for helping lead frames to exit from their magazine onto the backtrack or the front track.

A pull arm 230 is provided for moving leadframes between the front track and the backtrack.

In practice, each lead frame is provided and preheated by a leadframe case (213, 223) on turntable 214. The leadframe itself is carried to leadframe cases (213, 223) in turntable 214 by the pull arm 230. The turntable 214 of FIG. 4 is shown with two leadframes (231, 232) proximate on leadframe cases (213, 223) located near the periphery of the turntable.

We will now describe the stages of the use of the embodiment. From the point of view of a magazine A, it begins by moving along path 10 due to the upper conveyor 101 and into the upper holder 501. It is then carried by the elevator 401 to the ejector level 90. At this stage, the lead frame which is product A is pushed out of the magazine A, and indexed. The empty magazine is then emptied by being pushed along the path 30 by the holder 501, 601 that can move both vertically and horizontally.

Similarly, a magazine B is initially moved along path 20 by the conveyor 111, into the lower holder 601, and raised to the ejector level. There, the leadframe is pushed out and indexed. Then the empty magazine is pushed out onto the plate 120.

From the point of view of one of the leadframes, the process is as follows. It is conveyed within its magazine by one of its conveyors 101, 111 to one of the magazine holders 501, 601. It is carried to the ejector level, and there it is ejected by the ejector 204 to the front track defined by the front track mechanism 211. It is checked whether the orientation of the leadframe is correct. If it is, then the leadframe is moved onto the turntable by the pull arm 230. Otherwise, if the orientation is wrong, the pull arm 230 moves the leadframe onto the backtrack defined by the backtrack mechanism 221 and pull arm 230 then moves it onto the track 223 of the turntable 214.

What is claimed is:

1. A method for processing a plurality of leadframe items to form integrated circuit packages, each of the leadframe items comprising an integrated circuit carried by a suitable leadframe, the leadframe items being of two or more types, the method comprising the steps of:

receiving each of the leadframe items along a respective input path;

moving a plurality of holders corresponding in number to the types of leadframe items to be processed alternately between a processing region and a respective leadframe item reception position on a respective input path such that each of the holders moves to the processing region at a time when the other of the holders moves to its respective reception position;

transferring the leadframe items from their respective input paths to respective ones of the holders at the respective reception positions;

delivering the leadframe items to the processing region; and at the processing region, sending the leadframe items for encapsulation.

2. The method according to claim 1 in which the plurality of holders are portions of a single member, the step of moving the holders being a motion of the member.

3. The method according to claim 2, in which the motion is a reciprocating motion and the processing region is located between the reception positions.

4. The method according to claim 3 in which the reception positions are respectively above and below the processing region.

5. The method according to claim 1 in which the leadframe items are provided in corresponding magazines, the holders receiving the leadframe items within the corresponding magazines, and the method further including extracting the leadframe items from the magazines in the processing region.

* * * * *